United States Patent
Zuo et al.

(10) Patent No.: US 9,692,386 B2
(45) Date of Patent: Jun. 27, 2017

(54) THREE-DIMENSIONAL WIRE BOND INDUCTOR

(71) Applicant: QUALCOMM Incorporated, San Diego, CA (US)

(72) Inventors: Chengjie Zuo, Santee, CA (US); Mario Francisco Velez, San Diego, CA (US); Jonghae Kim, San Diego, CA (US); Daeik Daniel Kim, San Diego, CA (US); Changhan Hobie Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 157 days.

(21) Appl. No.: 14/177,620

(22) Filed: Feb. 11, 2014

(65) Prior Publication Data

US 2015/0180437 A1    Jun. 25, 2015

Related U.S. Application Data (60) Provisional application No. 61/920,334, filed on Dec. 23, 2013.

(51) Int. Cl.
*H03H 7/01* (2006.01)
*H01F 27/28* (2006.01)
*H01L 23/522* (2006.01)

(52) U.S. Cl.
CPC ....... *H03H 7/0115* (2013.01); *H01F 27/2866* (2013.01); *H01L 23/5223* (2013.01); *H01L 23/5227* (2013.01); *H01L 2224/45144* (2013.01); *H01L 2224/4813* (2013.01); *H01L 2224/48091* (2013.01); *H01L 2224/48464* (2013.01); *Y10T 29/417* (2015.01)

(58) Field of Classification Search
CPC .............. H03H 7/0115; H01F 27/2823; H01F 27/2866; H01L 23/5223; H01L 23/5227
USPC ................... 333/175, 185; 336/200; 361/271
See application file for complete search history.

(56) References Cited

U.S. PATENT DOCUMENTS

| | | | | |
|---|---|---|---|---|
| 3,648,132 A | * | 3/1972 | Rayburn | H01G 4/255 29/25.42 |
| 4,255,728 A | * | 3/1981 | Doty, Jr. | H03H 5/02 333/185 |
| 5,051,712 A | * | 9/1991 | Naito | H01F 17/0013 333/184 |
| 5,331,298 A | * | 7/1994 | Kameya | H01F 27/29 29/605 |

(Continued)

FOREIGN PATENT DOCUMENTS

| | | |
|---|---|---|
| EP | 1202296 A1 | 5/2002 |
| JP | H10289921 A | 10/1998 |

(Continued)

OTHER PUBLICATIONS

International Search Report and Written Opinion—PCT/US2014/070517—ISA/EPO—Apr. 10, 2015.

*Primary Examiner* — Stephen E Jones
*Assistant Examiner* — Rakesh Patel
(74) *Attorney, Agent, or Firm* — Loza & Loza, LLP/Qualcomm (57) ABSTRACT

An inductor is provided on a substrate that includes a capacitor. The inductor comprises a series of wire loops. An end of the wire loop is wire bonded to the capacitor.

30 Claims, 7 Drawing Sheets

(56) References Cited

U.S. PATENT DOCUMENTS

| | | | |
|---|---|---|---|
| 5,963,110 A * | 10/1999 | Ihara | H04L 25/03878 333/167 |
| 6,424,223 B1 | 7/2002 | Wang et al. | |
| 6,586,309 B1 * | 7/2003 | Yeo | H01L 23/5227 257/531 |
| 7,305,223 B2 * | 12/2007 | Liu | H01L 23/5227 257/528 |
| 8,111,521 B2 | 2/2012 | Kamgaing et al. | |
| 8,558,645 B2 | 10/2013 | Hu et al. | |
| 2003/0122219 A1 * | 7/2003 | Park | H01F 17/0006 257/531 |
| 2005/0285262 A1 | 12/2005 | Knapp et al. | |
| 2006/0139124 A1 * | 6/2006 | Fojas | H01P 5/02 333/185 |
| 2008/0079115 A1 | 4/2008 | Wang | |
| 2010/0090781 A1 * | 4/2010 | Yamamoto | H01L 23/66 333/167 |
| 2013/0207745 A1 | 8/2013 | Yun et al. | |

FOREIGN PATENT DOCUMENTS

| | | |
|---|---|---|
| JP | 4591689 B2 | 12/2010 |
| WO | WO-2005008694 A1 | 1/2005 |

* cited by examiner

FIG. 4

THREE-DIMENSIONAL WIRE BOND INDUCTOR

RELATED APPLICATION

This application claims the benefit of U.S. Provisional Application No. 61/920,334, filed Dec. 23, 2013, the contents of which are hereby incorporated by reference in their entirety.

TECHNICAL FIELD

This application relates to an integrated circuit package including an inductor.

BACKGROUND

High quality (Q) factor inductors and capacitors are needed to achieve high performance resonant tank circuits. For example, use of high-Q resonant tank circuits can improve efficiency and lower distortion and harmonics in an RF front end and enable lower insertion losses and higher out-of-band rejections in filters and diplexers. In addition, high-Q resonant tank circuits improve RF sensitivity and selectivity.

The quality factor for an inductor or capacitor is inversely related to its direct current (DC) resistance (Rdc). While it may be relatively easy to achieve a high-Q inductor or capacitor using a discrete conventional inductor or capacitor in non-mobile applications in which space is not an issue, there is no space for such discrete components in a compact integrated design. One approach to increasing component density is thus to integrate the desired inductors and capacitors into metal layers of a package substrate. The metal layers used to form the capacitor are typically quite thin to reduce its parasitic inductance. But the interconnection between the resulting inductor and capacitor is conventionally formed in one of these relatively-thin metal layers, which increase the DC resistance and thus lowers the resulting quality factor. Alternatively, the passive components may be integrated onto the die but the metal layer thickness in modern CMOS processes is so thin that the DC resistance of the resulting passive components is also relatively high. As a result, the quality factor for die-integrated or package-integrated inductors, capacitors, and LC resonant tank circuits is limited to too low a value for the high-performance needed for RF designs.

Accordingly, there is a need in the art for integrated resonant tank circuits with improved quality factors.

SUMMARY

An inductor is provided that comprises a plurality of wire loops or arches. An end of one of the wire loops is wire bonded to a capacitor. The wire bond introduces very little parasitic resistance such that the interconnection between the inductor and the capacitor is virtually lossless. In this fashion, the quality factor of a resulting resonant tank circuit formed by the inductor and the capacitor is advantageously enhanced.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

A three-dimensional inductor is provided that may advantageously be incorporated into a resonant tank circuit to provide a high Q factor. In a conventional integrated resonant tank circuit, an interconnection such as a lead or trace formed in a patterned metal layer couples an inductor to a capacitor. Such a conventional interconnection has an undesirably high amount of parasitic resistance because the patterned metal layer is typically relatively thin and thus lowers the quality factor of the resulting resonant tank circuit. In contrast, the three-dimensional inductor disclosed herein solves this problem and provides a reduced parasitic resistance (e.g., DC resistance, Rdc) for the interconnection between the inductor (L) and capacitor (C) components of the resonant tank circuit. The parasitic resistance of the inductor-to-capacitor interconnection is virtually eliminated as described further herein.

The three-dimensional (3D) inductor includes a plurality of wire coils or loops that arch away from the substrate. The wire loops are interconnected by one or more inductor connecting portions. The inductor connecting portions are deposited or otherwise formed on a planar surface of the substrate. The planar surface may be defined using two Cartesian dimensions. In contrast, the wire coils or loops arch away from the planar surface of the substrate and thus extend in a third Cartesian dimension. For example, the planar substrate surface may be deemed to extend in the Cartesian x and y dimensions whereas the wire loops also extend into the z dimension. The resulting integrated inductor may thus be designated as three-dimensional as opposed to integrated inductors formed using planar structures.

Each inductor connecting portion couples to a pair of wire loops. As implied by the name, each inductor connecting portion functions to interconnect the corresponding pair of wire loops. For example, if there are three wire loops ranging from a first wire loop, a second wire loop, and finally a third wire loop, there would be at least two corresponding inductor connecting portions. In such an embodiment, an end of the first wire loop is wire bonded to a first one of the inductor connecting portions. Similarly, an end of the second wire loop is also wire bonded to the first inductor connecting portion. A remaining end of the second wire loop is wire bonded to a second inductor connecting portion. Finally, an end of the third wire loop is also wire bonded to the second inductor connecting portion. More generally, if the three-dimensional inductor includes N wire loops (N being an integer of two or greater), there would be at least N−1 inductor connecting portions.

Referring again to an example three-dimensional inductor having three wire loops, it will be appreciated that both ends of the second wire loop are coupled to respective inductor connecting portions—one end is coupled to the first inductor connecting portion whereas a remaining end is coupled to the second inductor connecting portion. The first wire loop has one end coupled to the first inductor connecting portion but there is of course another end to this first wire loop. It is this "free" end of the first wire loop that forms a first terminal for the resulting three-dimensional inductor. Similarly, the third wire loop has one end coupled to the second inductor connecting portion but of course has another end as well. It is this remaining end of the third wire loop that forms a remaining second terminal for the three-dimensional inductor. Regardless of the number of wire loops used in a three-dimensional inductor embodiment, one wire loop may be deemed as the "starting" wire loop in that it will have one of the free ends. Similarly, another wire loop may be deemed as the "ending" wire loop in that it will have the remaining free end. It is these two wire loops that provide the first and second terminals for the three-dimensional inductor.

The substrate supporting the three-dimensional inductor also supports a metal-insulator-metal (MIM) capacitor. One of the terminals for the three-dimensional inductor is wire bonded to the MIM capacitor. In that regard, the MIM capacitor includes a first metal layer separated by a dielectric layer from a second metal layer. The metal layers may also be designated as metal plates. The first metal layer lies between the substrate and the dielectric layer whereas the second metal layer is exposed on the dielectric layer. In other words, the second metal layer may be deemed as the "uppermost" metal layer on the substrate surface. One of the free ends for the three-dimensional inductor is wire-bonded to the exposed second metal layer of the MIM capacitor. This is quite advantageous since the wire bonding results in virtually no parasitic interconnect resistance between the three-dimensional inductor and the MIM capacitor. The interconnected three-dimensional inductor and the MIM capacitor may form an integrated resonant tank circuit that provides a higher quality factor than conventional integrated resonant tank architectures. Moreover, this improvement in quality factor is provided at low cost since the wire bonding process is economical and reliable. In addition, the substrate footprint for the three-dimensional inductor is smaller than conventional two-dimensional inductors due to the use of the extra dimension. These advantageous features may be better appreciated through the following discussion of some example embodiments

EXAMPLE EMBODIMENTS

Figure 1A:
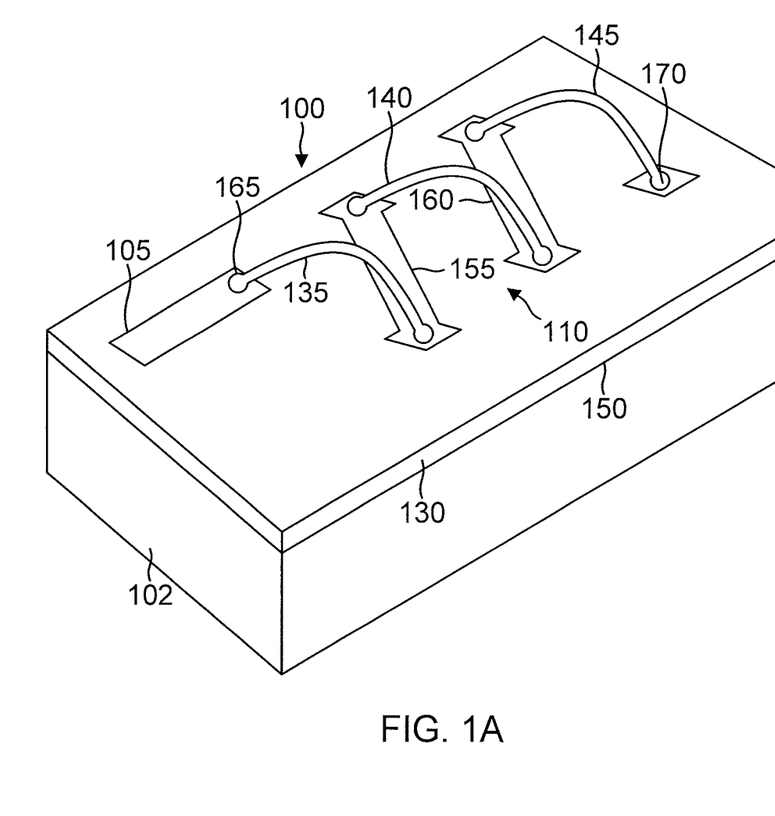
FIG. 1A is a perspective view of a three-dimensional inductor in accordance with an embodiment of the disclosure.

Turning now the drawings, FIG. 1A is a perspective view of an example three-dimensional inductor 110 within an integrated passive device (IPD) package 100. Three-dimensional inductor 110 may be integrated onto a substrate 102 such as a glass substrate, a semiconductor substrate, or an organic substrate to form a resonant tank circuit. Inductor 110 includes a plurality of wire loops including a wire loop 135, a wire loop 140, and a wire loop 145. Inductor 100 also includes a plurality of inductor connecting portions such as an inductor connecting portion 155 and an inductor connecting portion 160. In contrast to wire loops 135, 140, and 145 that all arch away from a planar substrate surface 150, inductor connecting portions 155 and 160 are planar structures that are substantially parallel to a plane defined by substrate surface 150. Thus, as discussed earlier, inductor 110 is an embodiment of a "three-dimensional" inductor. As also discussed earlier, a starting one of the wire loops will have an end that is not connected to any inductor connecting portion. It is this free end that may advantageously be wire bonded to the MIM capacitor. For example, wire loop 135 may be deemed as the starting wire loop, which has an end 165 that is wire bonded to a MIM capacitor 105. End 165 is thus a first terminal for inductor 110. Inductor connecting portion 155 couples wire loop 135 in series with wire loop 140. Similarly, inductor connecting portion 160 couples wire loop 140 in series with wire loop 145. Wire loop 145 may be deemed as the ending wire loop in inductor such that an end 170 of wire loop 145 forms an opposing second terminal for inductor 110. End 170 may be wire bonded to a pad or other suitable interconnection to inductor 110. It will be appreciated that the number of wire loops may be varied from the three shown for inductor 100. In general, the number of wire loops depends upon the desired inductance and other factors. For example, an embodiment having only two wire loops would have one inductor connecting portion. Similarly, an embodiment having four wire loops would have three inductor connecting portions. It may thus be seen that that the number of inductor connecting portions is one less than the number of wire loops.

Figure 1B:
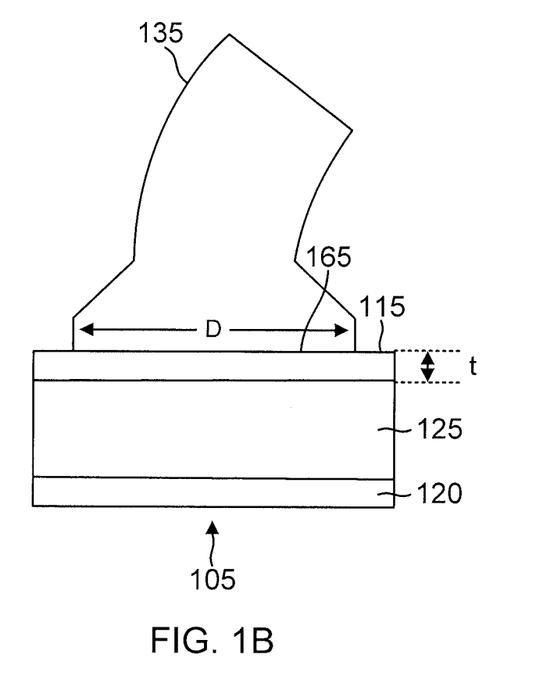
FIG. 1B is an enlarged cross-sectional view of a wire-bonded portion of the inductor and the adjacent metal-insulator-metal (MIM) capacitor of FIG. 1A.

FIG. 1B is a cross-sectional view of a wire-bonded end 165 of wire loop 145 and MIM capacitor 105. MIM capacitor 105 may comprise a first metal layer or plate 120 insulated from a second metal layer or plate 115 by a dielectric layer 125. Due to the wire bond, wire loop 135 directly couples to metal layer 115 and thus capacitively couples to metal layer 120 across the insulating dielectric layer 125. In this fashion, three-dimensional inductor 100 (FIG. 1A) couples to MIM capacitor 105 through wire-bonded end 165 of first wire loop 135. Referring again to FIG. 1A, MIM capacitor 105 may lie within a passivation or dielectric layer 130 on substrate 102. In one embodiment, MIM capacitor 105 defines a plane that is substantially parallel with planar surface 150 of substrate 102. Because of this planarity, MIM capacitor 105 may be deemed to comprise a two-dimensional structure. Similarly, inductor connecting portions 155 and 160 may also be deemed to comprise two-dimensional structures. In contrast, wire loops or coils 135, 140, and 145 form arches above the plane defined by substrate surface 150. Thus, inductor 110 may be deemed to comprise a three-dimensional structure in contrast to MIM capacitor 105.

To maximize the resulting inductance for three-dimensional inductor 110, the centers of each wire loop may all be aligned along a longitudinal axis for inductor 110 in some embodiments. In this fashion, the magnetic field induced by current flowing through each wire loop reinforces the magnetic field produced by the remaining wire loops. Given such an alignment, inductor connecting portions 155 and 160 are also aligned so as to be substantially parallel to each other. But it will be appreciated that the wire loop centers need not be longitudinally aligned in alternative embodiments. For example, inductor connecting portion 160 may have a longitudinal axis that is canted with regard to a longitudinal axis for inductor connecting portion 155. There are thus alternative embodiments in which the various inductor connecting portions are not parallel to each in contrast to three-dimensional inductor 100 of FIG. 1A.

Inductor connecting portions 155 and 160 may comprise a patterned metal layer such as a patterned copper or nickel metal layer. For example, copper may be electroplated onto substrate 102 to form inductor connecting portions 155 and 160. In contrast to the first metal layer 120 and second metal layer 115, the metal layer forming inductor connecting portions 155 and 160 may be relatively thick in some embodiments such as at least 20 microns in thickness so as to increase the inductor quality factor. Conversely, first metal layer 115 and second metal layer 120 may be relatively thin in some embodiments. For example, first metal layer 115 and second metal layer 120 may be just a few microns in thickness (or less) so that their perimeters may be precisely defined. In this fashion, the resulting capacitance for capacitor 105 is also precisely defined in such embodiments. In addition, the parasitic inductance for capacitor 105 is reduced if metal layers 115 and 120 are relatively thin in comparison to inductor connecting portions 155 and 160.

To provide the advantageously low parasitic resistance between MIM capacitor 105 and three-dimensional inductor 110, end 165 of wire loop 135 is directly wire bonded to second metal layer 115. Alternatively, a metallic pad (not illustrated) may be deposited on second metal layer 115 such that end 165 of wire loop 135 wire bonds to the pad instead of directly to second metal layer 115. The use of such a pad is advantageous if second metal layer 115 is too thin to accept a wire bond. For example, if second metal layer 115 is thinner than two to three microns, it may be too thin such that wire bonding would be unsuccessful. A pad formed in an additional metal layer (not illustrated) would thus allow end 165 of wire loop 135 to be wire bonded to second metal layer 115 in such embodiments.

Wire loops 135, 140, and 145 may a sufficiently large diameter to provide a low resistance. For example, wire loops 135, 140, and 145 may each have a diameter of at least 100 microns in some embodiments. Due to the wire bonding process, end 165 will widen as it bonds with second metal layer 115 so that end 165 will have a diameter D as shown in FIG. 1B that is even greater than the diameter for the bulk of wire loop 135. Thus, the surface area for end 165 of wire loop 145 is relatively large such that the parasitic resistance is minimal. In contrast, a conventional inductor-to-capacitor interconnection may comprise a patterning of second metal layer 115 to also form a lead that in turn couples to end 165 of wire coil 135. As discussed previously, second metal layer 115 may be relatively thin such that an interconnect formed from such a similarly thin metal layer would be much more resistive than the wire bonding of end 165 to second metal layer 115.

The cross-sectional area for current flow through interface 151 between end 165 of wire loop 135 and second metal layer 115 is approximately given by $\pi (D/2)^2 = (\pi/4)D^2$, where D is the diameter of end 165 for wire loop 135. If second metal layer 115 formed a conventional lead of length D (not illustrated) for interconnecting capacitor 105 to inductor 110, the resulting inductor-to-capacitor interconnection would have a cross-sectional area of D*t, where t is the thickness of second metal layer 115. The ratio of the cross-sectional area of end 165 to such a conventional interconnect cross-sectional area is thus $\pi*D/t$. Since D for a typical wire coil may be approximately 100 microns or greater whereas the thickness t may be relatively thin such as 3 microns, wire-bonded interconnection 151 offers roughly 100 times the cross-sectional area of a conventional inductor-to-capacitor interconnection. Wire bonding a free end of a three-dimensional inductor to an exposed metal layer for a capacitor thus provides a markedly reduced parasitic resistance as compared to conventional inductor-to-capacitor interconnects. Capacitor 105 and inductor 110 may be considered to be coupled in series or in parallel. As known in the resonant tank arts, the resulting resonant frequency for such a coupling is proportional to 1/square root (L*C), where L is the inductance for inductor 110 and C is the capacitance for capacitor 105. The resulting resonant tank circuit advantageously has a high quality factor for the reasons discussed above. Moreover, it is relatively economical to construct due to the wire bonding for inductor 110. Some example methods of manufacture will now be discussed.

Example Methods of Manufacture

Figure 2A:
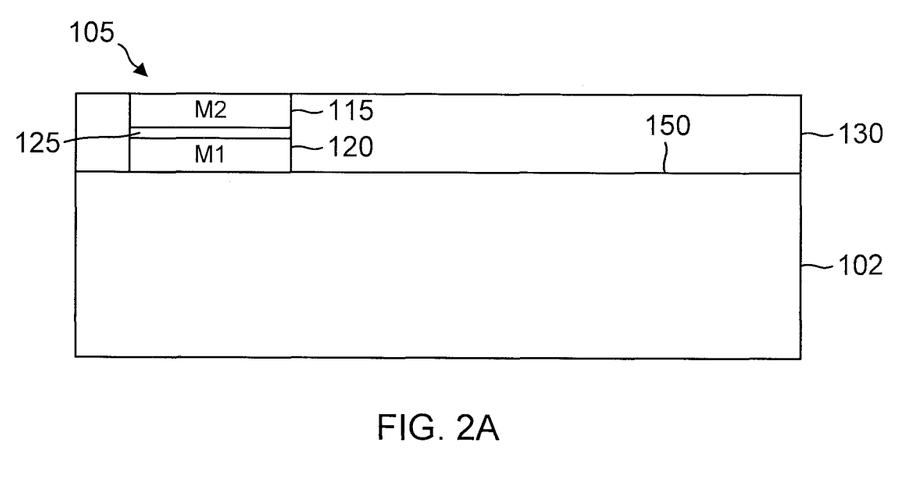
FIG. 2A is a cross-sectional view of the substrate of FIG. 1A after formation of the MIM capacitor and prior to formation of the inductor.

Manufacture of package 100 may begin by depositing first metal layer 120 onto surface 150 of substrate 102 as shown in FIG. 2A. For example, aluminum or other metals such as copper or nickel may be sputtered or plated onto surface 150 and patterned to form first metal layer 120. In some embodiments, first metal layer 120 may be just a few microns in thickness or less to enhance the precision of its patterning. In turn, such precision reduces the capacitance tolerance for the resulting MIM capacitor 105.

Dielectric layer 125 may then be deposited using, for example, an atomic layer deposition of a dielectric material such as such as $Al_2O_3$, $Ta_2O_3$, $SiN_X$, $ZrO_2$, $Al_2O_3/ZrO_2$ sandwich, $SrTiO_3$, and $Ba_xSr_{1-x}TiO_3$. It will be appreciated that a wide variety of other dielectric materials are also suitable to form dielectric layer 125. For example dielectric layer 125 may comprise tantalum oxide. Dielectric layer 125 may be deposited relatively thinly to enhance the capacitance for the resulting MIM capacitor 105. For example, dielectric layer 125 may have a thickness of tens to several hundred Angstroms in some embodiments.

After dielectric layer 125 has been deposited and patterned, second metal layer 115 may be deposited and patterned analogously as discussed with regard to first metal layer 120. Dielectric layer 130 may then be deposited such as through a spun-on layer of polyimide or other types of dielectric polymers such as Ajinomoto build-up film, or benzocyclobutene-based polymer. Alternatively, dielectric layer 130 may be laminated onto substrate 102. Regardless of how it is deposited, dielectric layer 130 would then cover not only substrate 102 but would cover MIM capacitor 105. Dielectric layer 130 may be patterned to expose second metal layer 115. Alternatively, MIM capacitor 105 may be masked off prior to deposition of dielectric layer 130.

Figure 2B:
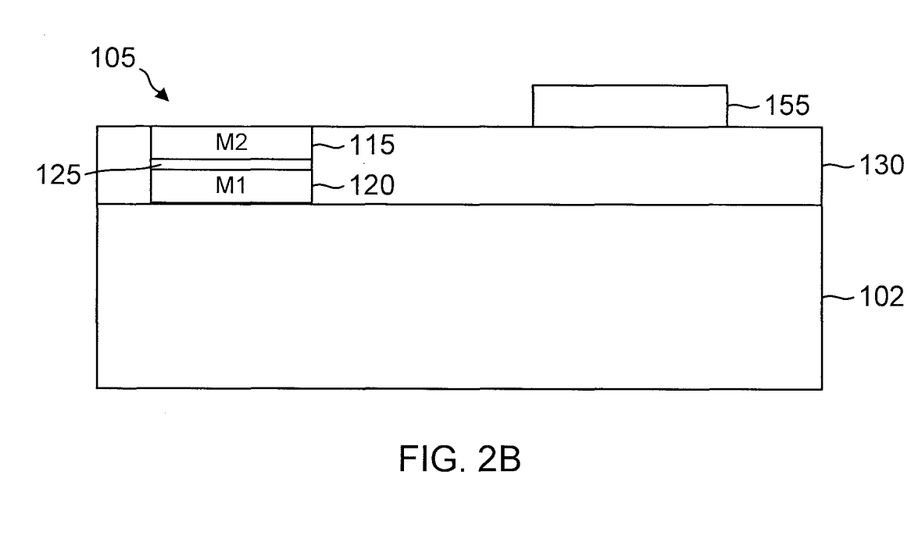
FIG. 2B is a cross-sectional view of the substrate of FIG. 2A after formation of an inductor-connecting portion.

As shown in FIG. 2B, an inductor connecting portion such as portion 155 may then be deposited onto dielectric layer 130. For example, metal such as copper or nickel may be electrodeposited or plated onto dielectric layer 130. In some embodiments, the inductor connecting portions may be relatively thick such as tens of microns in thickness so as to enhance the inductance of the resulting three-dimensional inductor.

Figure 2C:
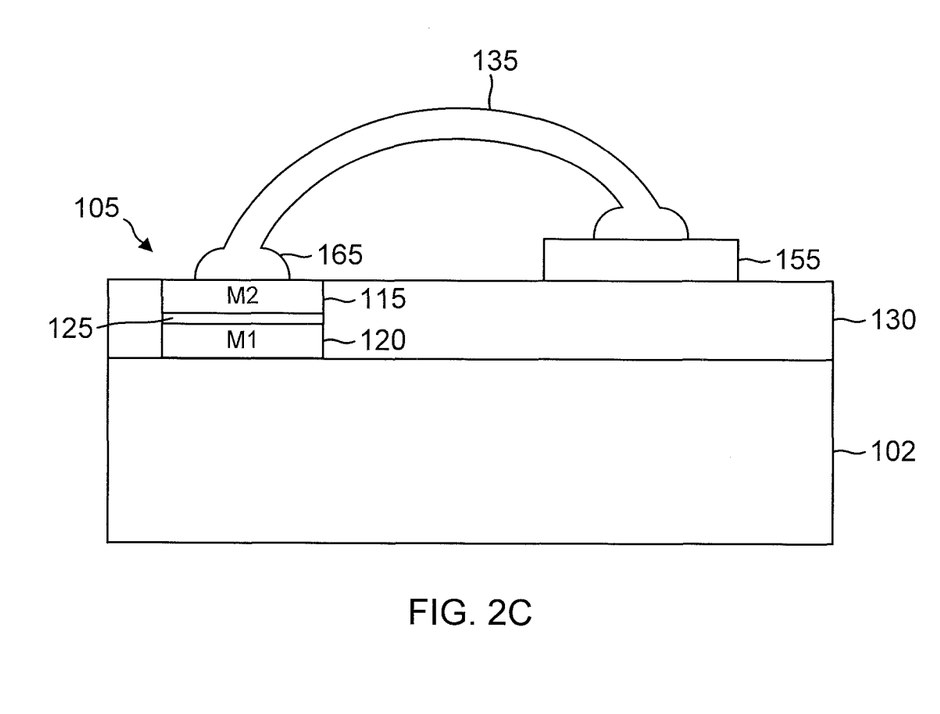
FIG. 2C is a cross-sectional view of the substrate of FIG. 2B after wire-bonding a wire arch or loop to a metal layer of the MIM capacitor and to the inductor-connecting portion.

With the inductor connecting portions formed, the wire loops may be wire-bonded to the inductor-connecting portions and to MIM capacitor 105. For example, wire loop 135 may be wire-bonded to second metal layer 115 and to inductor connecting portion 155 as shown in FIG. 2C. The remaining wire loops are wire bonded analogously to complete the resonant tank package. For example, referring again to FIG. 1A, wire loop 140 is wire bonded to inductor connecting portions 155 and 160. In that regard, wire loop 140 is wire bonded to inductor connecting portion adjacent a first end of inductor connecting portion 155 whereas wire loop 135 is wire bonded adjacent to an opposing second end of inductor connecting portion 155. Similarly, wire loop 145 is wire bonded to inductor connecting portions 160 and also to pad 170.

Figure 3:
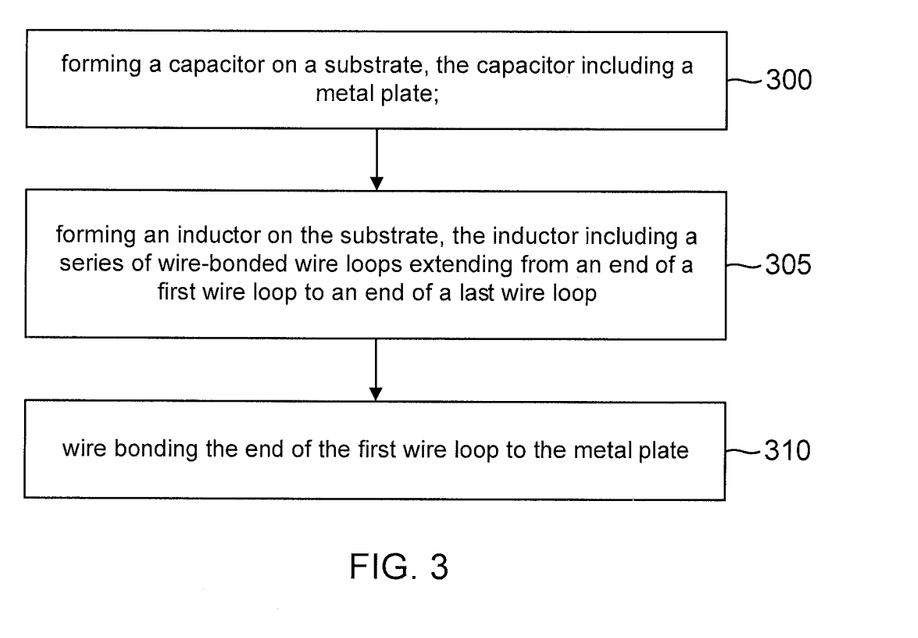
FIG. 3 is a flowchart for a method of manufacture for a three-dimensional inductor in accordance with an embodiment of the disclosure.

A manufacturing method embodiment may be summarized as shown in the flowchart of FIG. 3. The method begins with a step 300 of forming a capacitor on a substrate, the capacitor including a metal plate on a substrate. An example of such a step is the formation of MIM capacitor 105 as discussed with regard to FIG. 2A. In particular, metal layer 115 provides an example of the metal plate in step 300.

The method also includes a step 305 of forming an inductor on the substrate, the inductor including a series of wire-bonded wire loops extending from an end of a first wire loop to an end of the second wire loop. An example of such a step is discussed above such as with regard to wire loop 135 of FIG. 2C.

Finally, the method includes an act 315 of bonding the end of the first wire loop to the metal plate. An example of such an act is also discussed with regard to wire loop 135 of FIG. 2C. In this fashion, a resonant LC tank circuit comprising the inductor and capacitor are integrated onto the substrate very economically and with high quality factors.

An example electronic system will now be discussed.

Example Electronic Systems

Figure 4:
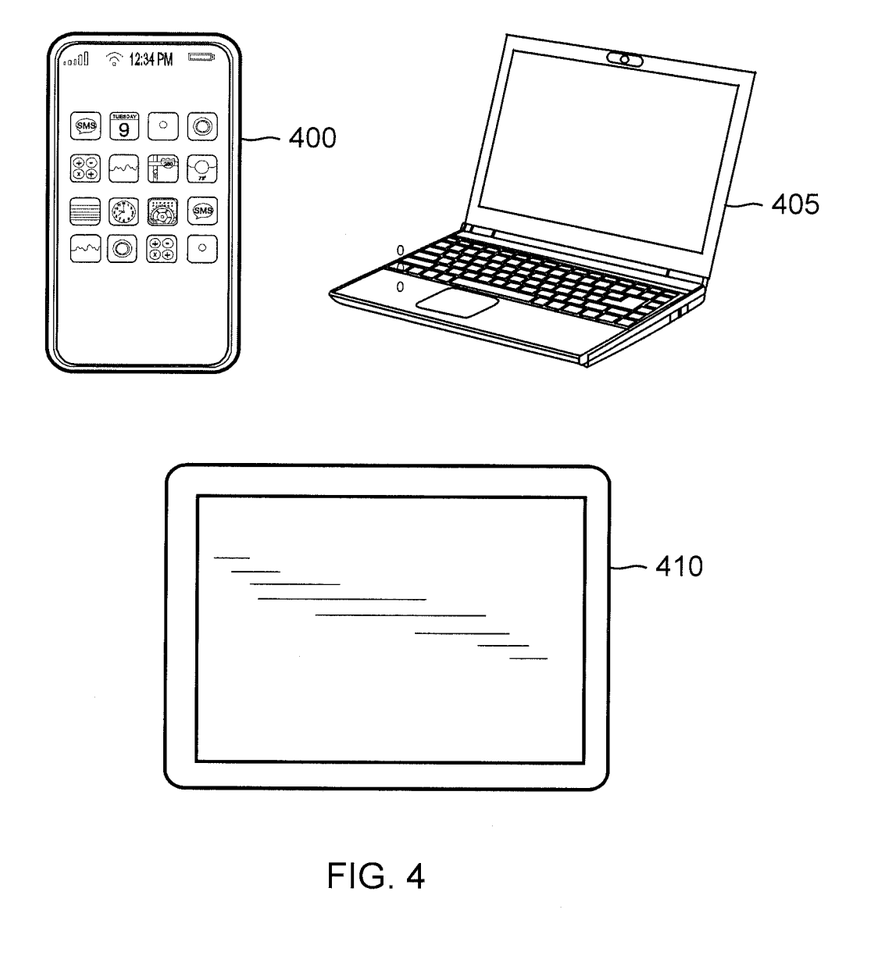
FIG. 4 illustrates some example electronic systems incorporating an embedded inductor package in accordance with an embodiment of the disclosure.

A package including a resonant tank circuit as disclosed herein may be incorporated into a wide variety of electronic systems. For example, as shown in FIG. 4, a cell phone 400, a laptop 405, and a tablet PC 410 may all include an integrated circuit package incorporating a resonant tank circuit constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An apparatus, comprising:
a substrate including a surface;
a capacitor integrated with the substrate, the capacitor including a metal plate adjacent the surface;
a series of wire loops configured to project from the surface with each wire loop forming an arch extending above the surface; and
planar inductor connecting portions on the surface and configured to couple the wire loops to form an inductor; and
wherein the inductor extends from a first end of a first one of the series of wire loops to a second end of a last one of the series of wire loops, wherein the first end of the first wire loop forms a first terminal of the inductor and the second end of the last one of the series of wire loops forms a second terminal of the inductor, and further wherein the first terminal of the inductor is bonded directly to the metal plate of the capacitor.

2. The apparatus of claim 1, further comprising a first inductor connecting portion of the planar inductor connecting portions that is adjacent the surface, wherein a second end of the first wire loop is wire bonded to the first inductor connecting portion, and wherein a first end of a second one of the wire loops is wire bonded to the first inductor connecting portion and further wherein the first inductor connecting portion forms part of the inductor.

3. The apparatus of claim 2, wherein:
the first inductor connecting portion of the planar inductor connecting portions has a first thickness of at least 20 microns; and
the metal plate of the capacitor has a second thickness of between 2 and 3 microns.

4. The apparatus of claim 1, wherein at least one of the planar inductor connecting portions has a length greater than a width of the inductor.

5. The apparatus of claim 1, wherein opposing ends of at least one of the planar inductor connecting portions are offset relative to one another along an axis of the inductor.

6. The apparatus of claim 1, wherein the series of wire loops form a truncated spiral shape.

7. The apparatus of claim 1, further comprising a pad on the surface of the substrate, wherein the end of the last wire loop is bonded to the pad.

8. The apparatus of claim 1, wherein an end of at least one loop in the series of wire loops is connected across an axis of the inductor to an end of an adjacent loop in the series of wire loops by a corresponding planar inductor portion of the planar inductor connecting portions.

9. The apparatus of claim 1, wherein the metal plate comprises a second metal layer exposed on a dielectric layer, the capacitor further comprising:
a first metal layer on the surface of the substrate; and
the dielectric layer disposed between the first metal layer and the second metal layer.

10. The apparatus of claim 1, wherein none of the planar inductor connecting portions is perpendicular to an axis of the inductor.

11. The apparatus of claim 1, wherein the center of at least one wire loop in the series of wire loops is aligned along an axis of the inductor.

12. The apparatus of claim 1, wherein the substrate is a passivation layer.

13. The apparatus of claim 1, wherein the wire loops are configured so that a magnetic field induced by current flowing through each wire loop reinforces a magnetic field produced by the other wire loops of the series of wire loops.

14. The apparatus of claim 1, wherein the metal plate of the capacitor is relatively thin compared to the planar inductor connecting portions.

15. A method, comprising:
forming a capacitor on a substrate, wherein forming the capacitor includes forming a metal plate;
forming an inductor on the substrate, wherein forming the inductor includes forming a series of wire-bonded loops with each wire loop forming an arch extending above a surface of the substrate, and
forming planar inductor connecting portions on the surface and configured to couple the wire loops to form the inductor, wherein the inductor extends from a first terminal at a first end of a first wire loop to a second terminal at a second end of a last wire loop on the substrate; and
bonding the first end of the first wire loop directly to the metal plate.

16. The method of claim 15, further comprising depositing a dielectric layer on a surface of the substrate and then electroplating an inductor connecting portion of the planar inductor connecting portions on a surface of the dielectric layer, wherein forming the inductor comprises wire bonding a second end of the first wire loop to the inductor connecting portion and wire bonding a first end of a second wire loop to the inductor connecting portion and further wherein the inductor connecting portion forms part of the inductor.

17. The method of claim 15, wherein the metal plate of the capacitor is formed to be relatively thin compared to the planar inductor connecting portions.

18. The method of claim 15, wherein opposing ends of at least one of the planar inductor connecting portions are formed to be offset relative to one another along an axis of the inductor.

19. The method of claim 15, wherein the series of wire loops are formed into a truncated spiral shape.

20. The method of claim 15, wherein an end of at least one loop in the series of wire loops is formed to connect across an axis of the inductor to an end of an adjacent loop in the series of wire loops by a corresponding planar inductor portion of the planar inductor connecting portions.

21. The method of claim 15, wherein none of the planar inductor connecting portions is formed perpendicular to an axis of the inductor.

22. The method of claim 15, wherein the center of at least one wire loop in the series of wire loops is formed to be aligned along an axis of the inductor.

23. The method of claim 15, wherein the substrate is formed as a passivation layer.

24. The method of claim 15, wherein the wire loops are formed so that a magnetic field induced by current flowing through each wire loop reinforces a magnetic field produced by the other wire loops of the series of wire loops.

25. The method of claim 15, wherein forming the capacitor comprises:
depositing a first metal layer on a surface of the substrate;
depositing a dielectric layer on the first metal layer;
depositing a second metal layer on the dielectric layer, wherein the metal plate comprises the second metal layer; and
exposing the second metal layer of the dielectric layer.

26. The method of claim 25, wherein depositing the first and second metal layers comprises sputtering, and wherein bonding the first end of the first wire loop comprises wire bonding the first terminal of the inductor to the metal plate and wire bonding the second terminal of the inductor to a pad.

27. The method of claim 15, wherein at least one of the planar inductor connecting portions is formed to have a length greater than a width of the inductor.

28. A resonant tank circuit, comprising:
a substrate;
a capacitor;
an inductor including a plurality of wire loops arranged from a first wire loop to a last wire loop with each wire loop forming an arch extending above a surface of the substrate, and planar inductor connecting portions on the surface of the substrate and configured to couple the wire loops to form the inductor, wherein a terminal of the first wire loop is wire bonded directly to the capacitor; and
wherein the capacitor and at least a portion of the inductor are integrated onto the substrate.

29. The resonant tank circuit of claim 28, further comprising at least one inductor connecting portion of the planar inductor connecting portions that is integrated onto the substrate, wherein the wire loops are wire bonded to the at least one inductor connecting portion and the at least one inductor connecting portion forms part of the inductor.

30. An apparatus, comprising:
a substrate having a surface;
a capacitor integrated with the substrate;
a plurality of wire loops including a first wire loop having a first terminal with each wire loop forming an arch extending above the surface of the substrate; and
means for coupling the wire loops together using corresponding planar inductor connecting portions on the surface to form an inductor, wherein a first end of the first wire loop forms the first terminal of the inductor, and further wherein the first terminal of the inductor is bonded directly to the capacitor.

* * * * *